United States Patent

Cini et al.

Patent Number: 5,287,055
Date of Patent: Feb. 15, 1994

[54] CIRCUIT FOR MEASURING CURRENT IN A POWER MOS TRANSISTOR

[75] Inventors: Carlo Cini; Domenico Rossi, both of Cornaredo, Italy; Marc Simon, Tournefeuille, France

[73] Assignees: Siemens Automotive S.A., Toulouse Cedex, France; SGS-Thomson Microelectronics, Agrate Brianza, Italy

[21] Appl. No.: 637,919

[22] Filed: Jan. 7, 1991

[30] Foreign Application Priority Data

Jan. 9, 1990 [IT] Italy ................................. 90 00401

[51] Int. Cl.$^5$ ...................... G01R 1/30; G01R 31/26
[52] U.S. Cl. ............................. 324/158 T; 324/123 R
[58] Field of Search ........... 324/158 T, 158 R, 123 R; 307/580, 491, 350, 358

[56] References Cited

U.S. PATENT DOCUMENTS

| 4,518,869 | 5/1985 | Herold | 307/350 |
| 4,588,950 | 5/1986 | Henley | 324/158 R |
| 4,789,825 | 12/1988 | Carelli et al. | |
| 5,013,935 | 5/1991 | Mahabadi | 307/350 |

FOREIGN PATENT DOCUMENTS

| 0249325 | 5/1987 | European Pat. Off. | |
| 0099569 | 8/1979 | Japan | 324/158 T |
| 0101679 | 8/1979 | Japan | 324/158 T |
| 0064135 | 4/1986 | Japan | 324/158 T |
| 0015475 | 1/1987 | Japan | 324/158 t |
| 0103945 | 4/1990 | Japan | 324/158 T |
| 0234076 | 9/1990 | Japan | 324/158 T |

OTHER PUBLICATIONS

Fay, "Current-Mirror FETs Cut Costs and Sensing Losses", Electrical Design News, Sep. 4, 1986, pp. 193–200.
Schultz, "Sense-Cell MOSFET Eliminates Losses in Source Circuit", Electrical Design News, Jun. 26, 1986, pp. 169–178.

*Primary Examiner*—Ernest F. Karlsen
*Attorney, Agent, or Firm*—Lowe, Price, LeBlanc & Becker

[57] ABSTRACT

A circuit for measuring current in a power MOS transistor (M0) comprises second (M1) and third (M2) transistors in series of the same type and same technology as, but having a smaller surface than, the power transistor and arranged in parallel on the latter. The two series transistors have their gates connected to the gate of the power transistor. The current in transistor (M2) which is connected to the reference electrode of the power transistor is measured.

7 Claims, 1 Drawing Sheet

CIRCUIT FOR MEASURING CURRENT IN A POWER MOS TRANSISTOR

BACKGROUND OF THE INVENTION

The present invention relates to measurement of current in a power transistor, and more particularly in a power MOS transistor, constituted by a plurality of parallel elementary cells.

FIG. 1 shows one of the most conventional circuits for measuring current in a power transistor M0. This circuit consists in arranging a measurement resistor $R_S$ between the power transistor terminal connected to voltage $V_S$ (the source) and the reference potential. The other terminal of the power transistor is connected to a high voltage through a load $R_L$ wherein flows a current $I_L$, identical in that case to the current in the power transistor. The measurement of voltage $V_S$ across resistor $R_S$ gives an indication of the current value.

This circuit exhibits several drawbacks.

The first drawback lies in the fact that resistor $R_S$ is constantly in series with the power MOS transistor and causes an increase in the dissipated power which is not negligible since resistor $R_S$ must have a sufficient value so that the voltage across its terminals is detectable.

Another drawback of this circuit is that resistor $R_S$ is liable to vary with temperature or differ from one manufacturing batch to another in a way independent of the possible variations of the power MOS transistor characteristics. As a result, one obtains an inaccurate determination of its value and therefore of the current being measured.

In order to avoid the first drawback, prior art circuits such as the one illustrated by FIG. 2 have been used. In this figure, the power MOS transistor M0 is shown The upper terminal (drain) of transistor M0 is connected to a positive supply terminal through the load $R_L$, the supply of which is to be controlled. The series connection of a transistor M1 and a resistor $R_S$ is arranged in parallel with the power transistor M0, the gates of transistors M0 and M1 being interconnected to voltage $V_{GS}$. It is clear that the first drawback is avoided, but the second drawback, that is, the possible fluctuations of resistor $R_S$ independent of the fluctuations of the other circuit elements is not eliminated.

SUMMARY OF THE INVENTION

Thus, the invention provides a process for measuring current in a power transistor which permits removal of the possible variations resulting from temperature or differences in the manufacturing process between resistor characteristics and MOS transistor characteristics.

To achieve this object and others, the invention provides a circuit for measuring current in a power MOS transistor. The circuit comprises second and third transistors in series with each other, being of the same type and same technology but having a smaller surface than the power transistor and arranged in parallel with the latter, these two series transistors having their gates connected to the gate of the power transistor, and means for measuring current in the transistor connected to the reference electrode source of the power transistor.

According to another embodiment of the invention, the current measuring means comprise a fourth MOS transistor connected as a current mirror with the third one.

According to a further embodiment of the invention, the drain of the third MOS transistor is connected to the noninverting input of an operational amplifier, the inverting input of which is connected to the drain of the fourth MOS transistor, the gate of which is connected to the gate of the third MOS transistor, the output of the operational amplifier being connected to the gate of a fifth transistor connected in series with the fourth transistor across the terminals of a supply source, the lower terminal of the fourth transistor being connected to the reference potential.

BRIEF DESCRIPTION OF THE DRAWINGS

The foregoing and other objects, features and advantages of the invention will be apparent from the following detailed description of a preferred embodiment as illustrated in the accompanying drawings wherein.

In the various figures, same reference labels designate identical or analogous elements.

Figure 1:
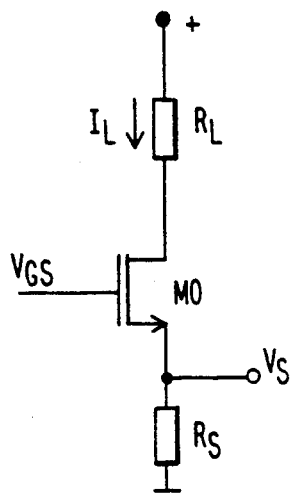
FIGS. 1 and 2, already described, illustrate the prior art.
Figure 2:
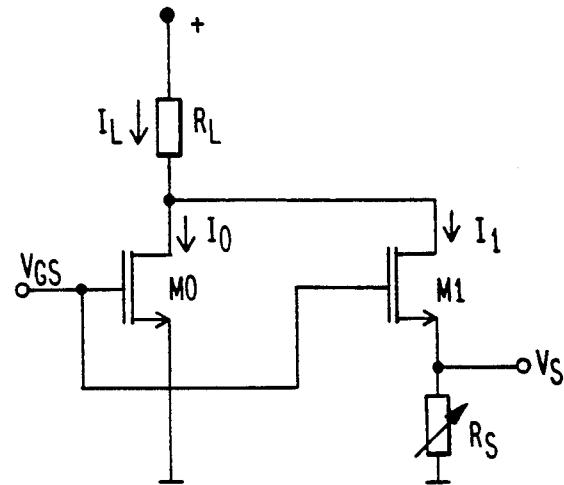
Figure 3:
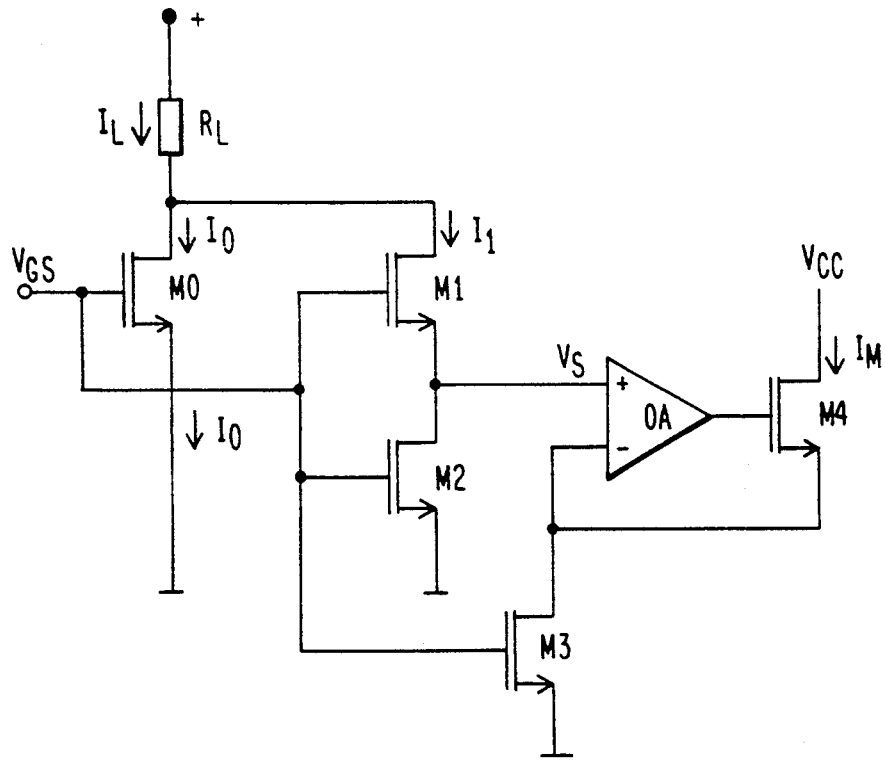
FIG. 3 schematically shows a circuit according to the invention.

In the circuit of FIG. 3, two series connected transistors M1 and M2 are arranged in parallel on with transistor M0. The gates of transistors M0, M1 and M2 are interconnected. The drains of transistors M0 and M1 are connected as well as the sources of transistors M0 and M2 which are set to the reference voltage potential, for example the ground.

Transistors M1 and M2 are of the same type as the power transistor M0. If transistor M0 is a power transistor of the multicell DMOS-type, transistors M1 and M2 are constituted by a small number of cells identical to the cells constituting transistor M0. In a practical example, transistor M0 may include 3,600 cells, transistor M1, 7 cells, and transistor M2, 14 cells.

If the voltage $V_{GS}$ is considered to be sufficiently high so that each transistor operates in its linear region, all these transistors will have resistances in the ON state strictly proportional to their number of cells when gate/source voltages are identical. It is be noted that the gate/source voltage of transistor M1 is slightly lower than the gate/source voltage of the other transistors since the source of transistor M1 is at a higher voltage than the sources of the other transistors. The source of transistor M1, instead of being directly connected to the reference voltage (the ground), is connected to the drain of transistor M2 and thence to ground. Thus, the gate/source voltage of transistor M1 is in fact $V_{GS}$(M0) minus the drain/source voltage drop across the terminals of transistor M2. However, this voltage drop is in practice about a few hundreds millivolts whereas the voltage $V_{GS}$ is chosen to be about 10 volts. Therefore, one can consider that the proportionality between the values of internal resistances in the conductive state of MOS transistors and their number of cells is a valid approximation for this circuit. In all cases, simulations made by users have shown that this result was obtained with an error lower than 5% and remained within this range whatever the variations in temperature and manufacturing technology may be, since the three transistors M0, M1 and M2 similarly vary with variations in temperature and technology.

It is possible to use the above described circuit for detecting if voltage $V_S$ exceeds a determined threshold corresponding for example to a load shorting. This voltage $V_S$ will be simply compared with a reference voltage through a comparator.

It is also possible to use this circuit for measuring current. For this purpose, an additional circuit will preferably be used such as shown in the righthand portion of FIG. 3 and comprising an operational amplifier OA and additional MOS transistors M3 and M4.

The amplifier OA receives on its non-inverting input the voltage to be measured, namely the drain voltage of transistor M2. The inverting input of the operational amplifier OA is connected to the reference voltage through an additional MOS transistor M3 of the same type as transistors M0, M1 and M2. The output of amplifier OA is connected to the gate of a MOS transistor M4, the drain of which is connected to a supply voltage VCC and the source is connected to the inverting input of amplifier OA.

With this circuit, the voltage on the inverting input tends to become equal to the voltage on the non-inverting input and therefore the current in transistor M3 (which will also be the current flowing through transistor M4) is equal to the current flowing through transistor M2 if these two transistors are identical. These currents are proportional to the number of cells constituting these transistors if the latter are distinct. The measurement current $I_M$ flowing through transistors M4 and M3 is:

$$I_M/I0 = (R0/R3)(R2/R1+R2),$$

where R0–R3 designate the resistances in the ON state of transistors M0–M3.

Thus, the ratio between the measurement current and the current in the power transistor only depends upon the ratio of the ON-resistances of the respective transistors constituted by identical cells. Therefore, this ratio is constant and substantially equal to the ratio of the number of cells constituting each transistor.

The invention encompasses all practical variants and modifications which will appear to those skilled in the art. Also, the circuit according to the present invention can be combined with other conventional circuits, for example circuits designed to cancel offset of the operational amplifier OA.

We claim:

1. A circuit for measuring current in a power MOS transistor, comprising:
    second and third transistors in series with each other, being of the same type and same technology as, but having a smaller surface than, the power transistor and arranged in parallel with said power transistor, said series transistors having their gates connected to the gate of the power transistor, and
    means for measuring current in said third transistor, said third transistor being connected to the same reference potential as the source of the power transistor,
    wherein each said MOS transistor comprises a plurality of identical cells, said power MOS transistor having a different number of cells than said second and third transistors.

2. A circuit for measuring current in a power MOS transistor, comprising:
    second and third transistors in series with each other, being of the same type and same technology as, but having a smaller surface than the power transistor and arranged in parallel with said power transistor, said series transistors having their gates connected to the gate of the power transistor; and
    means for measuring current in said third transistor, said third transistor being connected to the same reference potential as the source of the power transistor,
    wherein the drain of the third MOS transistor is connected to the non-inverting input of an operational amplifier, the inverting input of which is connected to the drain of the fourth MOS transistor, whose gate is connected to the gate of the third MOS transistor, the output of the operational amplifier being connected to the gate of a fifth transistor connected in series with the fourth transistor across the terminals of a supply source, the lower terminal of the fourth transistor being connected to the reference voltage.

3. A circuit for measuring current according to claim 2, wherein the fourth MOS transistor is identical to the fifth MOS transistor.

4. A circuit for measuring current according to claim 2, further comprising a circuit to cancel offset of said operational amplifier.

5. A circuit for measuring current according to claim 1, wherein each said MOS transistor comprises a plurality of identical cells, said power MOS transistor having a different number of cells than said second and third transistors.

6. A circuit for measuring current according to claim 5, wherein current through said power MOS transistor differs from current through said second transistor in proportion to a ratio of a number of said identical cells in said power MOS transistor to a number of said identical cells in said second MOS transistor.

7. A circuit for measuring current in a power MOS transistor, comprising:
    second and third transistors in series with each other, being of the same type and same technology as, but having a smaller surface than, the power transistor and arranged in parallel with said power transistor, said series transistors having their gates connected to the gate of the power transistor, and
    means for measuring current in said third transistor, said third transistor being connected to the same reference potential as the source of the power transistor,
    wherein said current measuring means comprise a fourth MOS transistor connected as a current mirror with said third MOS transistor.

* * * * *